United States Patent
Hong et al.

(10) Patent No.: US 7,893,441 B2
(45) Date of Patent: Feb. 22, 2011

(54) FLAT PANEL DISPLAY INCLUDING ELECTROSTATIC PROTECTION CIRCUIT

(75) Inventors: Soonkwang Hong, Daegu (KR); Jungchul Kim, Kyungbuk (KR); Hoyoung Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/461,653

(22) Filed: Aug. 19, 2009

(65) Prior Publication Data

US 2010/0155724 A1 Jun. 24, 2010

(30) Foreign Application Priority Data

Dec. 24, 2008 (KR) .................. 10-2008-0133495

(51) Int. Cl.
*H01L 27/12* (2006.01)
(52) U.S. Cl. .................. 257/72; 257/E27.111
(58) Field of Classification Search .......... 257/213, 257/288, 347–355, 49, 66, 72, E27.001, E27.009, 257/E27.111, E27.112, E27.113; 349/19, 349/33, 40

See application file for complete search history.

(56) References Cited

U.S. PATENT DOCUMENTS 6,337,722 B1 * 1/2002 Ha .................. 349/40

* cited by examiner

*Primary Examiner*—Minh-Loan T Tran
*Assistant Examiner*—Kevin Quinto
(74) *Attorney, Agent, or Firm*—McKenna Long & Aldridge LLP

(57) ABSTRACT

A flat panel display is disclosed. The flat panel display includes a display panel having a display area on which a plurality of pixels are formed, an inspection pad formed in a non-display area outside the display area of the display panel, an inspection switch formed in the non-display area, and an electrostatic protection circuit including a plurality of dummy thin film transistors (TFTs) whose gate electrodes are commonly connected to a signal line connecting the inspection pad to the inspection switch. The inspection pad contacts an external inspection device. The inspection switch applies an inspection signal received from the inspection pad to the pixels.

5 Claims, 6 Drawing Sheets

FLAT PANEL DISPLAY INCLUDING ELECTROSTATIC PROTECTION CIRCUIT

This application claims the benefit of Korea Patent Application No. 10-2008-0133495 filed on Dec. 24, 2008, which is incorporated herein by reference for all purposes as if fully set forth herein.

BACKGROUND OF THE INVENTION

1. Field of the Invention

Embodiments of the invention relate to a flat panel display, and more particularly, to a flat panel display including an electrostatic protection circuit capable of efficiently dispersing static electricity from the outside.

2. Discussion of the Related Art

Examples of a flat panel display includes a liquid crystal display (LCD), a plasma display panel (PDP), a field emission display (FED), and an organic light emitting diode (OLED) display. They have been put to practical use and are on the market.

The flat panel display includes an inspection pad for performing a light-on test and various aging processes before a process for bonding a last drive integrated circuit (IC) to a flexible printed circuit (FPC). Because the inspection pad occupies a very large area in the flat panel display, the inspection pad may serve as an electrostatic source.

In related art, various types of electrostatic protection circuits were proposed so as to solve problems resulting from static electricity. Examples of the electrostatic protection circuits include a protection circuit for charge dispersion configured by connecting panels to each other using a shorting bar and a protection circuit including electrostatic prevention diodes. However, the electrostatic protection circuit using the shorting bar does not have a way to solve static electricity generated after cutting the panel. The electrostatic protection circuit including the electrostatic prevention diodes, as shown in FIG. 1, disperses static electricity by employing diodes having nonlinear characteristics in response to a positive power source and a negative power source. Static electricity having positive charges generated in a signal line is dispersed through a positive voltage by a turn-on operation of a second diode D2. On the contrary, static electricity having negative charges generated in a signal line is dispersed through a negative voltage by a turn-on operation of a first diode D1 resulting from a punch-through phenomenon. Hence, the electrostatic protection circuit including the electrostatic prevention diodes protects various circuit elements of a display panel from the static electricity. However, because the electrostatic protection circuit normally operates when a power is supplied to the flat panel display, the static electricity cannot be solved in a cell state (i.e., in a state where the display panel is not driven). In other words, because the positive and negative voltages for operating the electrostatic protection circuit are produced by a power source of the display panel, the electrostatic protection circuit does not operate when the display panel does not operate.

FIG. 2 schematically illustrates a related art OLED display including an electrostatic protection circuit.

As shown in FIG. 2, the related art OLED display includes a display panel having a display area on which a plurality of pixels P each including an organic light emitting diode OLED, a driving element DT, a switch element ST, and a storage capacitor Cst are formed, a plurality of inspection pads V_DATA, VEN, and V_GATE formed in a non-display area outside the display area of the display panel, a plurality of inspection switches Ts and Td that are formed in the non-display area to apply inspection signals from the inspection pads V DATA, VEN, and V_GATE to the pixels P, and a plurality of electrostatic protection elements D1 and D2 protecting circuit elements inside the display panel from static electricity coming from the outside.

The inspection pads V_DATA, VEN, and VGATE are electrically connected to a probe inspection device for a light-on test or an aging device for an aging process and receive the inspection signals from the probe inspection device and the aging device. The inspection switches Ts and Td are thin film transistors (TFT) required to perform the light-on test and the aging process on the OLED display. The inspection switches Ts and Td are turned on in response to an enable signal from the inspection pad VEN to apply a scan signal SCAN and a data signal DATA from the inspection pads VGATE and V_DATA to the switch element ST and a data line DL of each of the pixels P.

However, in the related art OLED display, the inspection pads have a very large size, so as to effectively contact an external inspection device. Thus, the inspection pads serve as an electrostatic source. Further, the inspection pads serve as an insertion path of static electricity in the light-on test and the aging process. In particular, as described above, the electrostatic protection elements D1 and D2 cannot prevent the insertion of static electricity in the above inspection stage before the display panel is normally driven. Accordingly, in the related art OLED display, the inspection switches Ts and Td are damaged by the inserted static electricity, and the defective OLED display is generated in the light-on test and the aging process.

SUMMARY OF THE INVENTION

Embodiments of the invention provide a flat panel display including an electrostatic protection circuit capable of protecting circuit elements inside a display panel from static electricity entering into the display panel irrespective of a drive of the display panel.

In one aspect, there is a flat panel display comprising a display panel having a display area on which a plurality of pixels are formed, an inspection pad formed in a non-display area outside the display area of the display panel, the inspection pad contacting an external inspection device, an inspection switch formed in the non-display area, the inspection switch applying an inspection signal received from the inspection pad to the pixels, and an electrostatic protection circuit including a plurality of dummy thin film transistors (TFTs) whose gate electrodes are commonly connected to a signal line connecting the inspection pad to the inspection switch.

The electrostatic protection circuit includes at least three dummy TFTs.

A source electrode and a drain electrode of each of the dummy TFTs are floated.

One of a source electrode and a drain electrode of each of the dummy TFTs is not floated and is held at a constant voltage.

The electrostatic protection circuit further includes a plurality of charge dispersion capacitors, one electrode of each of the plurality of charge dispersion capacitors being connected to one electrode of each of the dummy TFTs.

The other electrode of each of the charge dispersion capacitors not connected to the dummy TFTs is floated.

The other electrode of each of the charge dispersion capacitors not connected to the dummy TFTs is held at a constant voltage.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings.

Figure 1:
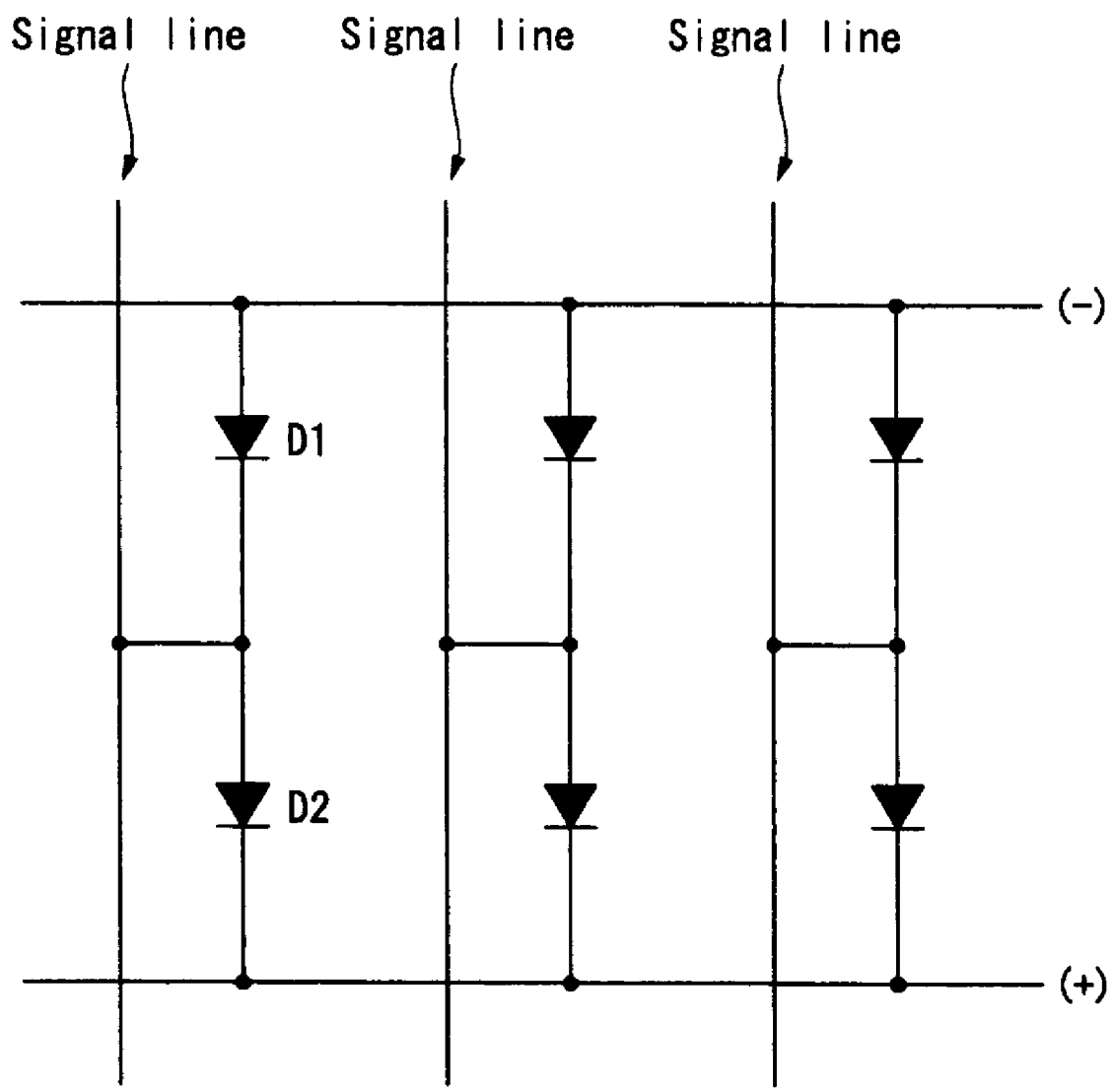
FIG. 1 schematically illustrates a related art electrostatic protection circuit using electrostatic prevention diodes.
Figure 2:
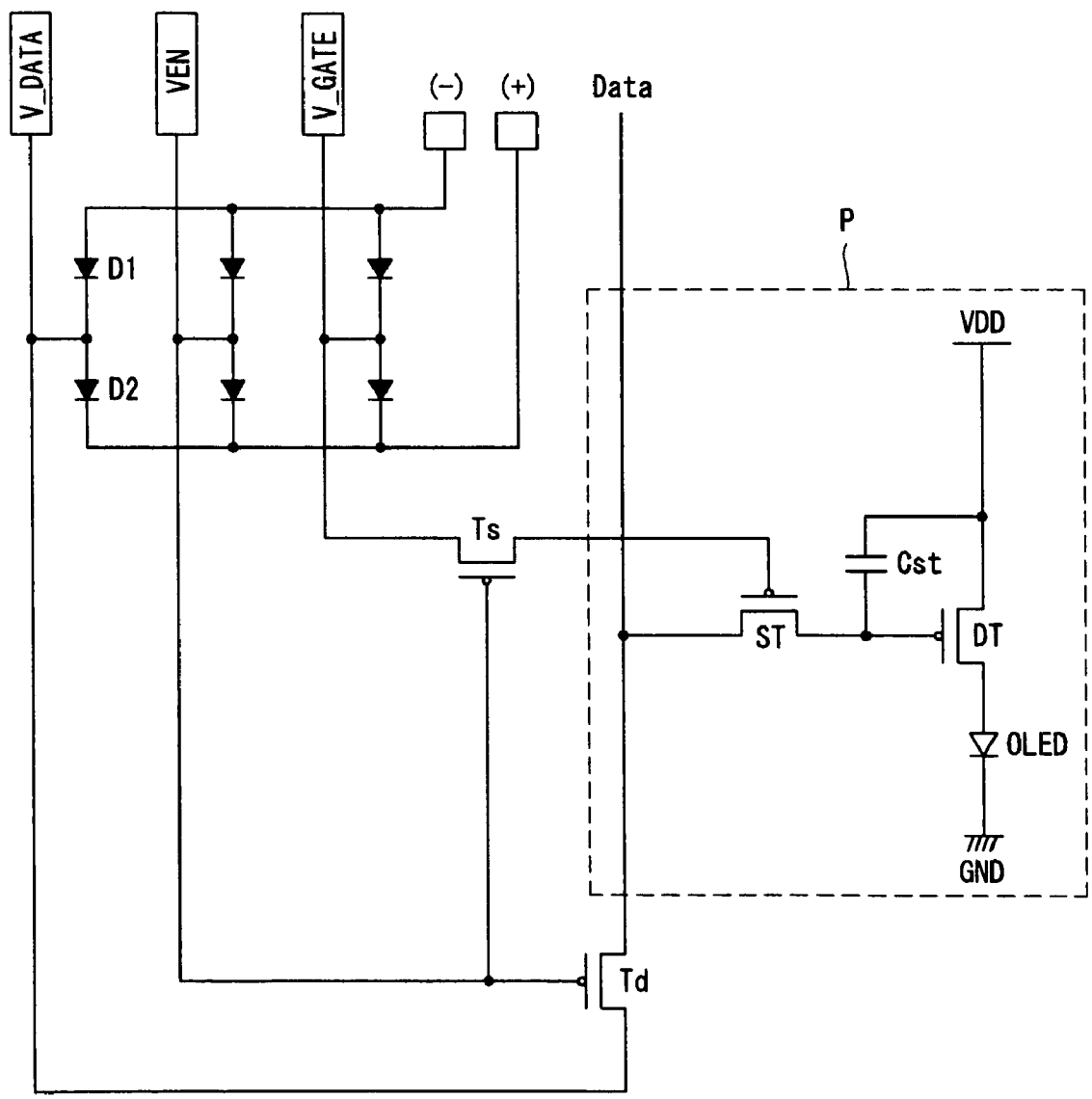
FIG. 2 schematically illustrates a related art organic light emitting diode (OLED) display including an electrostatic protection circuit.
Figure 3:
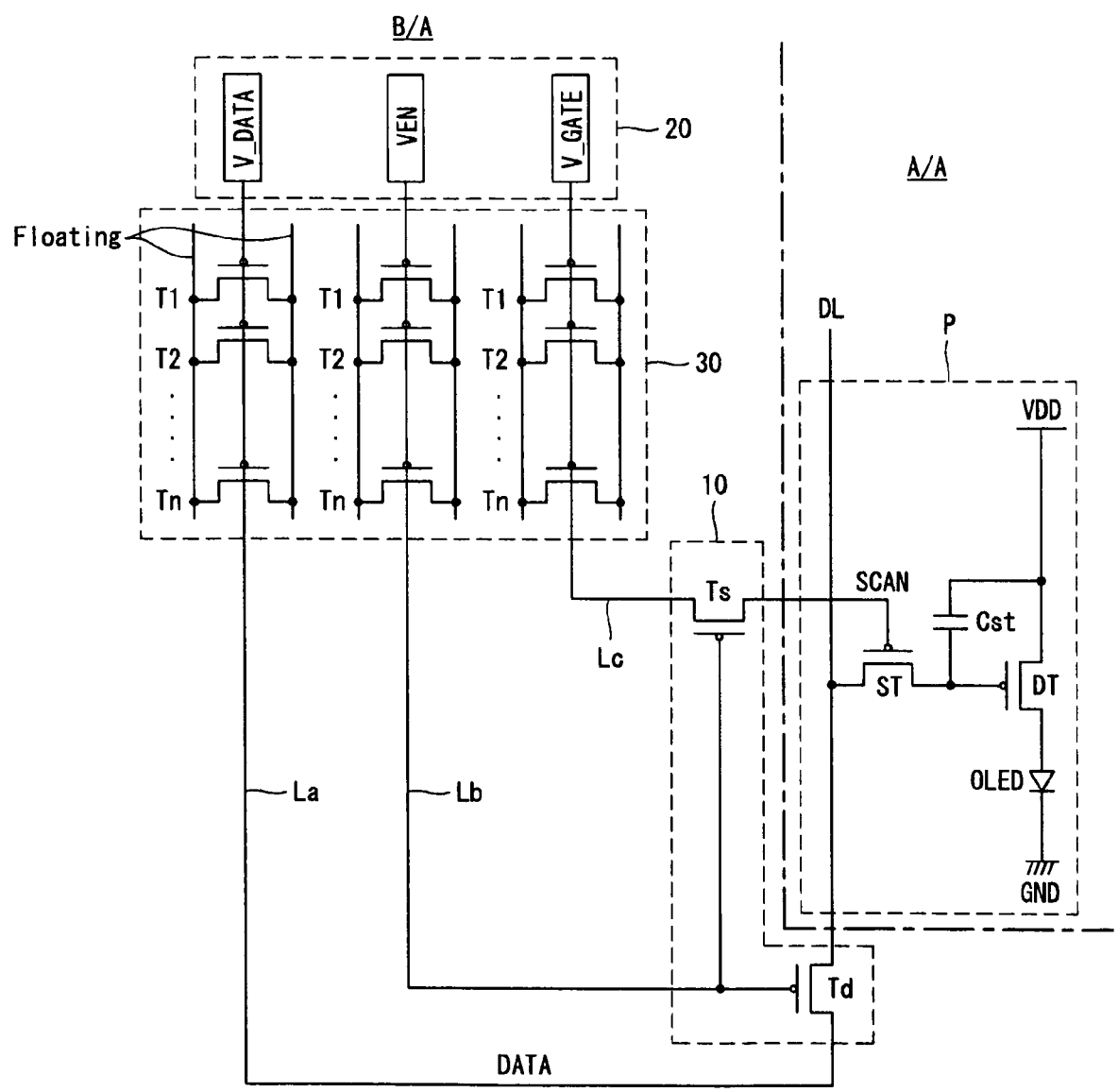
FIG. 3 illustrates a flat panel display including an electrostatic protection circuit according to an embodiment of the invention.

FIG. 3 illustrates a flat panel display including an electrostatic protection circuit according to an embodiment of the invention.

As shown in FIG. 3, a flat panel display according to an embodiment of the invention includes a display panel having a display area A/A on which a plurality of pixels P are formed, an inspection switch array 10 and an inspection pad array 20 formed in a non-display area B/A outside the display area A/A of the display panel, and an electrostatic protection circuit 30 protecting circuit elements inside the display panel from static electricity coming from the outside.

Each of the plurality of pixels P may include an organic light emitting diode OLED, a driving element DT, a switch element ST, and a storage capacitor Cst. The organic light emitting diode OLED emits light by a current flowing between a high potential driving voltage source VDD and a ground level voltage source GND. The driving element DT controls an amount of current flowing in the organic light emitting diode OLED using a voltage difference between a gate electrode and a source electrode of the driving element DT. The switch element ST is turned on in response to a scan signal SCAN received from the outside to apply a data signal DATA on a data line DL to the gate electrode of the driving element DT. The storage capacitor Cst keeps the voltage difference between the gate electrode and the source electrode of the driving element DT constant for a previously determined period of time.

The inspection pad array 20 includes a plurality of inspection pads V_DATA, VEN, and V GATE. The inspection pads V_DATA, VEN, and V_GATE are electrically connected to a probe inspection device for a light-on test or an aging device for an aging process and receive an inspection signal from the probe inspection device and the aging device.

The inspection switch array 10 includes a plurality of inspection switches Ts and Td. The inspection switch Ts is turned on in response to an enable signal from the control inspection pad VEN to apply the scan signal SCAN from the gate inspection pad V_GATE to the switch element ST of the pixel P. The inspection switch Td is turned on in response to the enable signal from the control inspection pad VEN to apply the data signal DATA from the data inspection pad V_DATA to the data line DL.

The electrostatic protection circuit 30 disperses static electricity generated from the outside to protect the circuit elements inside the display panel from the static electricity. For the above operation, the electrostatic protection circuit 30 includes a plurality of dummy thin film transistors (TFTs) whose gate electrodes are commonly connected to signal lines connecting the inspection pads V_DATA, VEN, and V_GATE to the inspection switches Ts and Td. More specifically, the electrostatic protection circuit 30 includes a plurality of dummy TFTs Ti to Tn whose gate electrodes are commonly connected to a first signal line La electrically connecting one electrode of the inspection switch Td to the data inspection pad V DATA, a plurality of dummy TFTs T1 to Tn whose gate electrodes are commonly connected to a second signal line Lb electrically connecting a control electrode of each of the inspection switches Td and Ts to the control inspection pad VEN, and a plurality of dummy TFTs T1 to Tn whose gate electrodes are commonly connected to a third signal line Lc electrically connecting one electrode of the inspection switch Ts to the gate inspection pad V_GATE. A source electrode and a drain electrode of each of the dummy TFTs Ti to Tn are floated. Alternatively, one of the source electrode and the drain electrode of each of the dummy TFTs T1 to Tn may not be floated and may receive a DC voltage so as to be held at a constant voltage. Before static electricity coming from the inspection pads V_DATA, VEN, and V_GATE reaches the inspection switches Td and Ts, the static electricity is dispersed through the dummy TFTs T1 to Tn. The number of dummy TFTs T1 to Tn assigned to each of the inspection pads V_DATA, VEN, and V_GATE may be 3 or more, so as to obtain a charge dispersion effect.

Figure 4:
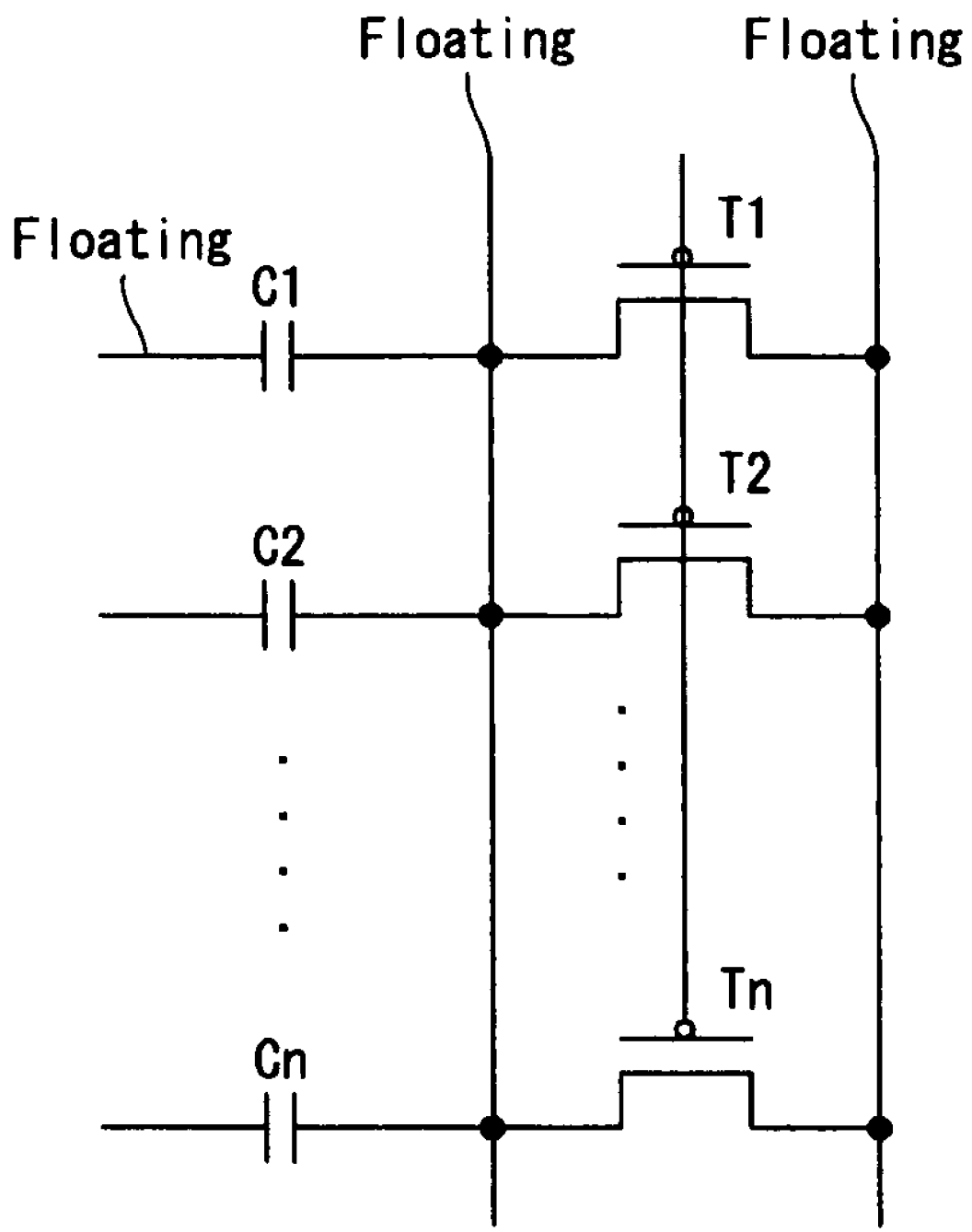
FIG. 4 illustrates that a charge dispersion capacitor is added to the electrostatic protection circuit.

In addition, the electrostatic protection circuit 30, as shown in FIG. 4, may further include a plurality of charge dispersion capacitors C1 to Cn, so as to increase the charge dispersion effect. One electrode of each of the plurality of charge dispersion capacitors C1 to Cn is connected to one electrode of each of the dummy TFTs T1 to Tn of each of the inspection pads V_DATA, VEN, and V_GATE. The other electrode of each of the charge dispersion capacitors C1 to Cn not connected to the dummy TFTs Ti to Tn is floated. Alternatively, the other electrode of each of the charge dispersion capacitors C1 to Cn may not be floated and may be configured so as to be held at a constant voltage.

Because the electrostatic protection circuit 30 does not need an operation voltage, the static electricity from the inspection pads V_DATA, VEN, and VGATE can be dispersed even in a state where the display panel is not driven (for example, an inspection state). Accordingly, the flat display device including the electrostatic protection circuit 30 can protect the inspection switches Ts and Td from the static electricity in the inspection state to thereby increase the yield and to secure price competitiveness.

Figure 5:
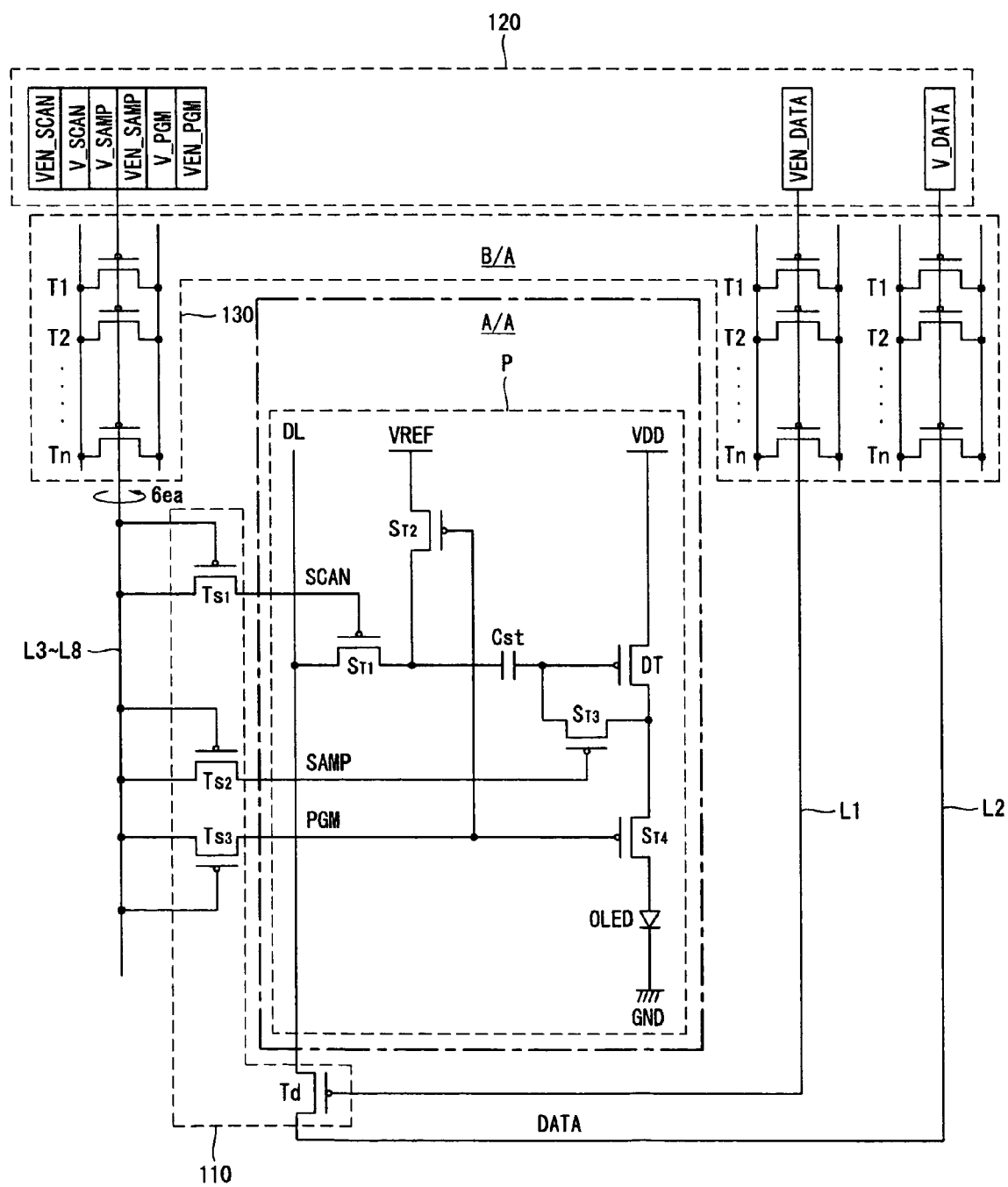
FIG. 5 illustrates a flat panel display including an electrostatic protection circuit according to another embodiment of the invention.

FIG. 5 illustrates a flat panel display including an electrostatic protection circuit according to another embodiment of the invention.

As shown in FIG. 5, a flat panel display according to another embodiment of the invention includes a display panel having a display area A/A on which a plurality of pixels P are formed, an inspection switch array 110 and an inspection pad array 120 formed in a non-display area B/A outside the display area A/A of the display panel, and an electrostatic protection circuit 30 protecting circuit elements inside the display panel from static electricity from the outside.

Each of the plurality of pixels P may include an organic light emitting diode OLED, a driving element DT, first to fourth switch elements ST1 to ST4, and a storage capacitor Cst. The organic light emitting diode OLED emits light by a current flowing between a high potential driving voltage source VDD and a ground level voltage source GND. The driving element DT controls an amount of current flowing in the organic light emitting diode OLED using a voltage difference between a gate electrode and a source electrode of the driving element DT. The third switch element ST3 is turned on in response to a sampling signal SAMP received from the outside to sense a threshold voltage of the driving element DT. The first switch element ST1 is turned on in response to a scan signal SCAN received from the outside to apply a data signal DATA on a data line DL to one electrode of the storage capacitor Cst. The second switch element ST2 is turned on in response to a programming signal PGM received from the outside to apply a programming voltage from a reference voltage source VREF to the one electrode of the storage capacitor Cst. The fourth switch element ST4 is turned on in response to the programming signal PGM received from the outside to form a current path between the driving element DT and the organic light emitting diode OLED. The storage capacitor Cst keeps a gate voltage of the driving element DT formed by switching operations of the first to fourth switch elements ST1 to ST4 constant.

An operation of the pixel P in response to the signals SCAN, SAMP, and PGM received from the outside may be briefly summed up as follows. During a sampling period, the third switch element ST3 is turned on to sample the gate voltage of the driving element DT to a voltage obtained by subtracting the threshold voltage of the driving element DT from a high potential driving voltage. The voltage obtained by subtracting the threshold voltage of the driving element DT from the high potential driving voltage is applied to the other electrode of the storage capacitor Cst. Further, during the sampling period, the first switch element ST1 is turned on to apply the data signal DATA to the one electrode of the storage capacitor Cst. During a programming period following the sampling period, the second switch element ST2 is turned on to apply the programming voltage less than a voltage level of the data signal DATA to the one electrode of the storage capacitor Cst. Hence, a potential of the one electrode of the storage capacitor Cst is reduced by a voltage difference between the data signal DATA and the programming voltage. Further, a potential of the other electrode of the storage capacitor Cst is reduced by the voltage difference because of a coupling effect. As a result, the gate voltage of the driving element DT is set to a voltage obtained by subtracting the voltage difference from the voltage obtained by subtracting the threshold voltage of the driving element DT from the high potential driving voltage. Further, during the programming period, the fourth switch element ST4 is turned on to apply a driving current determined by the finally set gate voltage of the driving element DT to the organic light emitting diode OLED.

The inspection pad array 120 includes a plurality of gate inspection pads VENSCAN, V_SCAN, VEN_SAMP, V_SAMP, VEN_PGM, and V_PGM and a plurality of data inspection pads VEN_DATA and V_DATA. The gate and data inspection pads are electrically connected to a probe inspection device or an aging device for an aging process and receive a plurality of inspection signals from the probe inspection device and the aging device.

Figure 6:
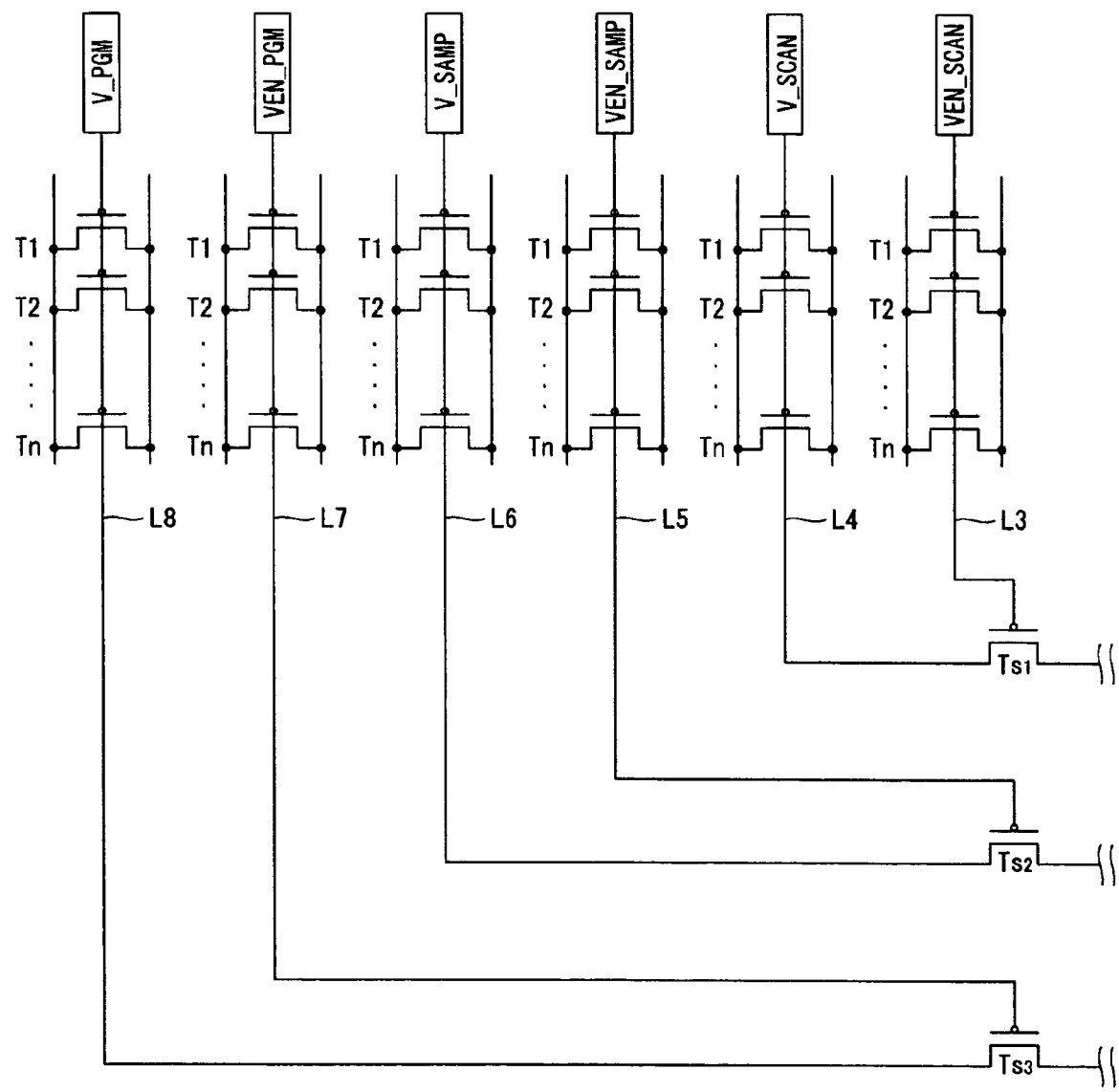
FIG. 6 illustrates in detail a portion of the flat panel display shown in FIG. 5.

The inspection switch array 110 includes a plurality of inspection switches Ts1 to Ts3 and Td. The inspection switch Ts1 is turned on in response to an enable signal from the scan control inspection pad VEN_SCAN to apply the scan signal SCAN from the scan inspection pad V_SCAN to the first switch element ST1 of the pixel P. The inspection switch Ts2 is turned on in response to the enable signal from the sampling control inspection pad VEN_SAMP to apply the sampling signal SAMP from the sampling inspection pad V_SAMP to the third switch element ST3 of the pixel P. The inspection switch Ts3 is turned on in response to the enable signal from the programming control inspection pad VEN_PGM to apply the programming signal PGM from the programming inspection pad V_PGM to the second and fourth switch elements ST2 and ST4 of the pixel P. The inspection switch Td is turned on in response to the enable signal from the data control inspection pad VEN_DATA to apply the data signal DATA from the data inspection pad V_DATA to the data line DL. Although FIG. 5 shows that the inspection switches Ts1 to Ts3 are connected to the plurality of gate inspection pads VEN_SCAN, V_SCAN, VEN_SAMP, V_SAMP, VEN_PGM, and V_PGM through the same signal line, this is a for the convenience of drawing. In fact, as shown in FIG. 6, each of the inspection switches Ts1 to Ts3 are independently connected to the two corresponding gate inspection pads through two signal lines.

The electrostatic protection circuit 130 disperses static electricity coming from the outside to protect the circuit elements inside the display panel from the static electricity. For the above operation, the electrostatic protection circuit 130 includes a plurality of dummy TFTs whose gate electrodes are connected to signal lines connecting the gate and data inspection pads to the inspection switches Ts1 to Ts3 and Td. More specifically, as shown in FIGS. 5 and 6, the electrostatic protection circuit 130 includes a plurality of dummy TFTs T1 to Tn whose gate electrodes are commonly connected to a first signal line L1 electrically connecting a control electrode of the inspection switch Td to the data control inspection pad VEN_DATA, a plurality of dummy TFTs T1 to Tn whose gate electrodes are commonly connected to a second signal line L2 electrically connecting one electrode of the inspection switch Td to the data inspection pad V_DATA, a plurality of dummy TFTs Ti to Tn whose gate electrodes are commonly connected to a third signal line L3 electrically connecting a control electrode of the inspection switch Ts1 to the scan control inspection pad VEN_SCAN, a plurality of dummy TFTs T1 to Tn whose gate electrodes are commonly connected to a fourth signal line L4 electrically connecting one electrode of the inspection switch Ts1 to the scan inspection pad V SCAN, a plurality of dummy TFTs T1 to Tn whose gate electrodes are commonly connected to a fifth signal line L5 electrically connecting a control electrode of the inspection switch Ts2 to the sampling control inspection pad VEN_SAMP, a plurality of dummy TFTs T1 to Tn whose gate electrodes are commonly connected to a sixth signal line L6 electrically connecting one electrode of the inspection switch Ts2 to the sampling inspection pad V_SAMP, a plurality of dummy TFTs T1 to Tn whose gate electrodes are commonly connected to a seventh signal line L7 electrically connecting a control electrode of the inspection switch Ts3 to the programming control inspection pad VEN_PGM, and a plurality of dummy TFTs T1 to Tn whose gate electrodes are commonly connected to an eighth signal line L8 electrically connecting one electrode of the inspection switch Ts3 to the programming inspection pad V PGM.

A source electrode and a drain electrode of each of the dummy TFTs T1 to Tn are floated. Alternatively, one of the source electrode and the drain electrode of each of the dummy TFTs T1 to Tn may not be floated and may receive a DC voltage so as to be held at a constant voltage. Before static electricity coming from the gate and data inspection pads reaches the inspection switches Ts1 to Ts3 and Td, the static electricity is dispersed through the dummy TFTs T1 to Tn. The number of dummy TFTs T1 to Tn assigned to each of the gate and data inspection pads may be 3 or more, so as to obtain a charge dispersion effect.

In addition, the electrostatic protection circuit 130 may further include a plurality of charge dispersion capacitors (not shown) in the same manner as FIG. 4, so as to increase the charge dispersion effect. One electrode of each of the plurality of charge dispersion capacitors is connected to one electrode of each of the dummy TFTs T1 to Tn of each of the gate and data inspection pads. The other electrode of each of the charge dispersion capacitors not connected to the dummy TFTs T1 to Tn is floated. Alternatively, the other electrode of each of the charge dispersion capacitors may not be floated and may be configured so as to be held at a constant voltage.

Because the electrostatic protection circuit 130 does not need an operation voltage, the static electricity from the gate and data inspection pads can be dispersed even in a state where the display panel is not driven (for example, an inspection state). Accordingly, the flat display device including the electrostatic protection circuit 130 can protect the inspection switches Ts1 to Ts3 and Td from the static electricity in the inspection state to thereby increase the yield and to secure price competitiveness.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flat panel display comprising:
   a display panel having a display area on which a plurality of pixels are formed;
   an inspection pad formed in a non-display area outside the display area of the display panel, the inspection pad contacting an external inspection device;
   an inspection switch formed in the non-display area, the inspection switch applying an inspection signal received from the inspection pad to the pixels; and
   an electrostatic protection circuit including a plurality of dummy thin film transistors (TFTs) whose gate electrodes are commonly connected to a signal line connecting the inspection pad to the inspection switch, and a plurality of charge dispersion capacitors, one electrode of each of the plurality of charge dispersion capacitors being connected to one electrode of each of the dummy TFTs,
   wherein the other electrode of each of the charge dispersion capacitors not connected to the dummy TFTs is floated.

2. The flat panel display of claim 1, wherein the electrostatic protection circuit includes at least three dummy TFTs.

3. The flat panel display of claim 1, wherein a source electrode and a drain electrode of each of the dummy TFTs are floated.

4. The flat panel display of claim 1, wherein one of a source electrode and a drain electrode of each of the dummy TFTs is not floated and is held at a constant voltage.

5. A flat panel display comprising:
   a display panel having a display area on which a plurality of pixels are formed;
   an inspection pad formed in a non-display area outside the display area of the display panel, the inspection pad contacting an external inspection device;
   an inspection switch formed in the non-display area, the inspection switch applying an inspection signal received from the inspection pad to the pixels; and
   an electrostatic protection circuit including a plurality of dummy thin film transistors (TFTs) whose gate electrodes are commonly connected to a signal line connecting the inspection pad to the inspection switch, and a plurality of charge dispersion capacitors, one electrode of each of the plurality of charge dispersion capacitors being connected to one electrode of each of the dummy TFTs,
   wherein the other electrode of each of the charge dispersion capacitors not connected to the dummy TFTs is held at a constant voltage.

* * * * *